United States Patent
Plat et al.

(10) Patent No.: US 6,541,360 B1
(45) Date of Patent: Apr. 1, 2003

(54) BI-LAYER TRIM ETCH PROCESS TO FORM INTEGRATED CIRCUIT GATE STRUCTURES

(75) Inventors: Marina V. Plat, San Jose, CA (US); Scott A. Bell, San Jose, CA (US); Christopher F. Lyons, Fremont, CA (US); Ramkumar Subramanian, Sunnyvale, CA (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/845,649

(22) Filed: Apr. 30, 2001

(51) Int. Cl.$^7$ .................... H01L 21/3205; H01L 21/302
(52) U.S. Cl. .................. 438/585; 438/736; 438/739; 438/947; 438/952
(58) Field of Search ................... 438/585, 735, 438/736, 737, 738, 739, 947, 952

(56) References Cited

U.S. PATENT DOCUMENTS

| | | | |
|---|---|---|---|
| 5,264,076 A | * 11/1993 | Cuthbert et al. ............ 438/751 |
| 5,346,587 A | 9/1994 | Doan et al. ................. 438/585 |
| 5,773,199 A | * 6/1998 | Linliu et al. ................ 430/316 |
| 5,804,088 A | 9/1998 | McKee ....................... 216/473 |
| 5,837,428 A | * 11/1998 | Huang et al. ............... 430/313 |
| 5,858,621 A | * 1/1999 | Yu et al. ..................... 430/313 |
| 5,883,011 A | 3/1999 | Lin et al. .................... 438/747 |
| 6,080,678 A | * 6/2000 | Yim .......................... 438/725 |
| 6,096,659 A | * 8/2000 | Gardner et al. ............. 438/736 |
| 6,136,679 A | * 10/2000 | Yu et al. ..................... 438/592 |
| 6,156,629 A | * 12/2000 | Tao et al. .................... 438/535 |

* cited by examiner

Primary Examiner—Stephen D. Meier
Assistant Examiner—Toniae M Thomas
(74) Attorney, Agent, or Firm—Foley & Lardner

(57) ABSTRACT

A bi-layer trim etch process to form integrated circuit gate structures can include depositing an organic underlayer over a layer of polysilicon, depositing an imaging layer over the organic underlayer, patterning the imaging layer, selectively trim etching the organic underlayer to form a pattern, and removing portions of the polysilicon layer using the pattern formed from the removed portions of organic underlayer. Thus, the use of thin imaging layer, that has high etch selectivity to the organic underlayer, allows the use of trim etch techniques without a risk of resist erosion or the aspect ratio pattern collapse. That, in turn, allows for the formation of the gate pattern with widths less than the widths of the pattern of the imaging layer.

26 Claims, 2 Drawing Sheets

BI-LAYER TRIM ETCH PROCESS TO FORM INTEGRATED CIRCUIT GATE STRUCTURES

CROSS REFERENCE TO RELATED APPLICATIONS

The present application is related to U.S. patent application Ser. No. 09/845,656 entitled USE OF SILICON CONTAINING IMAGING LAYER TO DEFINE SUB-RESOLUTION GATE STRUCTURES, filed on the same day by the same inventors and assigned to the same assignee as this application.

FIELD OF THE INVENTION

The present specification relates generally to integrated circuits and methods of manufacturing integrated circuits. More particularly, the present specification relates to a bi-layer trim etch process used in the formation of integrated circuit gate structures.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of IC devices on an IC, there is still a need to decrease the size of IC device features, and, thus, increase the number of devices on an IC.

One limitation to achieving smaller sizes of IC device features is the capability of conventional lithography. Lithography is the process by which a pattern or image is transferred from one medium to another. Conventional IC lithography uses ultra-violet (UV) sensitive photoresist. Ultra-violet light is projected to the photoresist through a reticle or mask to create device patterns on an IC. Conventional IC lithographic processes are limited in their ability to print small features, such as contacts, trenches, polysilicon lines or gate structures.

Generally, conventional lithographic processes (e.g., projection lithography and EUV lithography) do not have sufficient resolution and accuracy to consistently fabricate small features of minimum size. Resolution can be adversely impacted by a number of phenomena including: wavelength of light, diffraction of light, lens aberrations, mechanical stability of the resist, contamination, optical properties of resist material, resist contrast, resist swelling, thermal flow of resist, etc. As such, the critical dimensions of contacts, trenches, gates, and, thus, IC devices, are limited in how small they can be.

Another difficulty arising from the continuing small dimensions involved in the creation of gate structures is the tendency in the lithography process to experience resist erosion and pattern collapse during trim etch processes. During trim etch processes, a significant amount of the resist is normally etched away in a vertical direction, resulting, in a substantial weakening and thinning of the photoresist. This significant reduction of the vertical dimension or thickness of the photoresist from its untrimmed vertical dimension can promote discontinuity thereof, resulting in the photoresist being incapable of providing effective masking in the fabrication of the gate. The resist thickness erosion occurs during etch processes.

Thus, there is a need to pattern IC devices using non-conventional lithographic techniques. Further, there is a need to prevent resist erosion and pattern collapse during trim etch processes. Yet further, there is a need to use imaging layers to define gate structures having small critical dimensions.

SUMMARY OF THE INVENTION

An exemplary embodiment is related to a method of fabricating an integrated circuit (IC). This method can include depositing an organic underlayer over a layer of polysilicon, depositing an imaging layer over the organic underlayer, patterning the imaging layer, using the imaging layer as a hard mask to selectively trim etch the organic underlayer with an isotropic etch in a controlled manner in a high-density plasma etching system to form a pattern smaller than produced by the imaging layer, removing the hard mask imaging layer, and etching the portions of the polysilicon layer using the pattern formed by the organic underlayer.

Another exemplary embodiment is related to a method of forming a gate in an integrated circuit. This method can include providing a gate material layer, providing an organic mask layer over the gate material layer, providing an image layer over the organic mask layer, patterning the image layer, etching the organic mask layer with an undercutting technique, and etching the gate material layer to form gate structures.

Another exemplary embodiment is related to a method of preventing resist erosion and pattern collapse during a trim etch process in the manufacture of a gate structure. This method can include depositing an organic mask material layer over a polysilicon layer, providing a silicon-containing imaging layer that will act as a hard mask for the organic mask material layer, patterning the silicon-containing imaging layer according to a pattern of gate structures, selectively trim etching the imaging layer, etching away portions of the organic mask material layer uncovered by the trimmed imaging layer, and etching the portions of the polysilicon layer uncovered by the organic material layer to form gate structures. The top imaging layer acts as a hard mask to define the patterns in the organic layer, which in turn acts to mask the pattern during subsequent poly etch.

Other principle features and advantages of the invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE EXEMPLARY EMBODIMENTS

Figure 1:
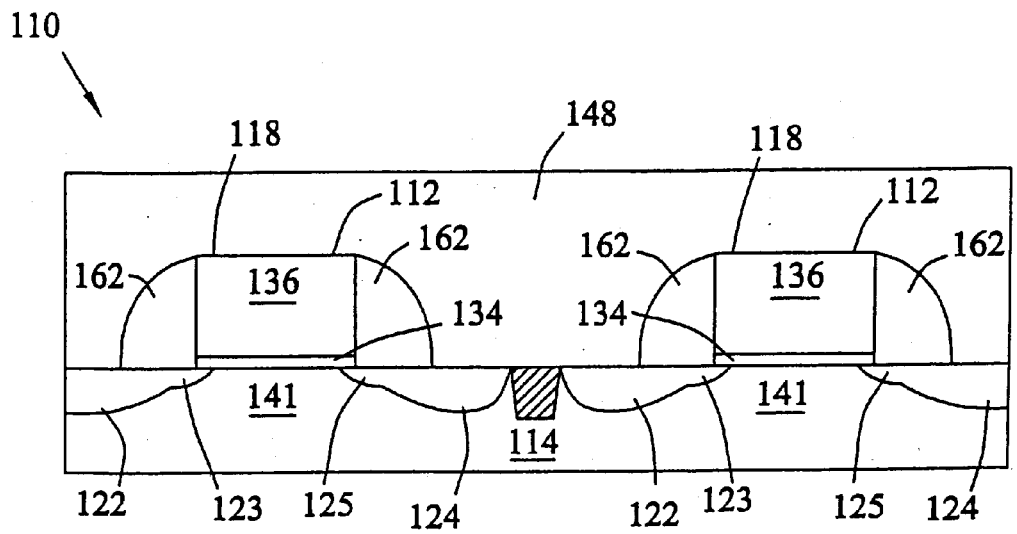
FIG. 1 is a schematic cross-sectional view representation of a portion of an integrated circuit fabricated in accordance with an exemplary embodiment.

With reference to FIG. 1, a portion 110 of an integrated circuit (IC) includes a transistor 112 which is disposed on a semiconductor substrate 114, such as, a wafer. Semiconductor substrate 114 is preferably a bulk P-type single crystalline (001) silicon substrate. Alternatively, substrate 114 can be an N-type well in a P-type substrate, an insulative substrate, a semiconductor-on-insulator (SOI) substrate, (preferably silicon-on-glass) or other suitable material for transistor 112.

Transistor 112 can be a P-channel or N-channel metal oxide semiconductor field effect transistor (MOSFET). Transistor 112 is preferably embodied as a MOSFET and includes a gate structure 118, a source region 122, and a drain region 124. Gate structure 118 advantageously includes single crystalline material that reduces variability in gate lengths due to grain structure. In one embodiment, gate structure 118 has a gate length between source region 122 and drain region 124 in the nanometer scale.

For an N-channel transistor, regions 122 and 124 are heavily doped with N-type dopants (e.g., $5 \times 10^{19}$–$1 \times 10^{20}$ dopants per cubic centimeter). For a P-channel transistor, regions 122 and 124 are heavily doped with P-type dopants ($5 \times 10^{19}$–$1 \times 10^{20}$ dopants per cubic centimeter). An appropriate dopant for a P-channel transistor is boron, boron diflouride, or iridium, and an appropriate dopant for an N-type transistor is arsenic, phosphorous, or antimony.

Source and drain regions 122 and 124 can be provided with extensions 123 and 125. Preferably, ultra-shallow extensions 123 and 125 (e.g., junction depth is less than 20 nanometers (nm), 100–250 Å) are integral with regions 122 and 124. Source and drain extensions 123 and 125 can be disposed partially underneath gate structure 118.

A channel region 141 underneath gate structure 118 separates regions 122 and 124. Region 141 can be doped according to device parameters. For example, region 141 can be doped according to a super steep retrograded well region.

Gate stack or structure 118 includes a gate conductor 136 and a gate dielectric layer 134. Alternatively, structure 118 can include three or more conductive or semiconductive layers.

Gate conductor 136 is preferably a polysilicon material. Gate conductor 136 has a thickness of 800–1600 Å and a width of less than 50 nm (e.g., channel length). Gate conductor 136 can be a semiconductor material implanted with dopants, with other semiconductive materials or can be an in situ doped material. Gate conductor 136 is also preferably heavily doped with an N-type dopant, such as phosphorous (P), arsenic (As) or other dopant. Alternatively, gate conductor 136 can be doped with a P-type dopant, such a boron (B), boron diflouride ($BF_2$), or other dopant.

Dielectric layer 134 is preferably a 15 to 25 Å thick thermally grown silicon dioxide layer. Alternatively, layer 134 can be a silicon nitride layer. Dielectric layer 134 can be comprised of a high-k dielectric material such as a 2–10 nm thick conformal layer of tantalum pentaoxide ($Ta_2O_5$), aluminum oxide ($Al_2O_3$), titanium dioxide ($TiO_2$) or other material having a dielectric constant (k) over 8.

A silicide layer can be disposed above source region 122, drain region 124, and conductor 136. Preferably, a nickel silicide $NiSi_x$ is utilized. Alternatively, the silicide layer can be any type of refractory metal and silicon combination, such as, a cobalt silicide, tungsten silicide, titanium silicide, or other silicide material.

Transistor 112 can be an N-channel or a P-channel field effect transistor, such as, a metal oxide semiconductor field effect transistor (MOSFET). Transistor 112 is at least partially covered by insulative layer 148 and is preferably part of an ultra-large scale integrated (ULSI) circuit that includes one million or more transistors.

Spacers 162 are preferably silicon nitride spacers and have a height of 800–1600 Å and a width of 400–600 Å. Spacers 162 abut side walls of conductor 136 and layer 134.

With reference to FIGS. 1–4, the fabrication of transistor 112, including gate conductor 136 is described as follows. The advantageous process allows gate structure to have a small critical dimension, such as, 30–100 nm. Further, the process described with respect to FIGS. 1–4 prevents resist erosion and pattern etch during the trim etch process.

Figure 2:
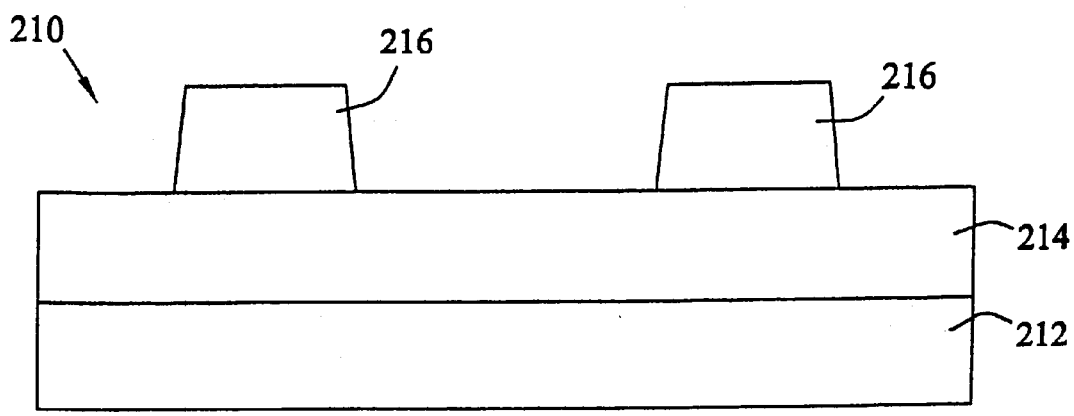
FIG. 2 is a schematic cross-sectional view representation of a portion of an integrated circuit, showing a deposition step.

Referring to FIG. 2, a schematic cross-sectional view representation of a portion 210 of an integrated circuit (IC) includes a polysilicon layer 212, an organic layer 214, and an imaging layer 216. Portion 210 is preferably part of an ultra-large-scale integrated (ULSI) circuit having millions or more-transistors. Portion 210 is manufactured as part of the IC on a semiconductor wafer, such as, a silicon wafer.

Polysilicon layer 212 can be any of a variety of materials which can serve as a portion of a gate structure 118 (FIG. 1). In an exemplary embodiment, polysilicon layer 212 can have a thickness of 500–2000 Angstroms. Alternatively, polysilicon layer 212 can be substituted by other materials suitable for gate conductor 136. Polysilicon layer 212 can be a metal or a single crystalline semiconductor material. Layer 212 can be in-situ doped or doped subsequently. In one embodiment, polysilicon layer 212 is an 800–1600 Angstrom polycrystalline layer deposited by chemical vapor deposition (CVD) or sputter deposition.

Organic layer 214 can be an anti-reflective coating (BARC) layer, a SILK (silicon-containing low-k) layer, a FLARE layer, or a BCB layer, for example. Organic layer 214 is located above polysilicon layer 212. In an exemplary embodiment, organic layer 214 has a thickness of 500–3000 Angstroms.

Imaging layer 216 can be Silicon or other inorganic material containing photo-image capable material. In one embodiment, imaging layer 216 has very different etch properties as compared to layers beneath it. Imaging layer 216 is thick enough to provide hard masking capability and thin enough to be easily eroded away or stripped during subsequent etch processes. In an exemplary embodiment, image layer 216 has a thickness of 500–2000 Angstroms. Once imaging layer 216 has been patterned by exposing portions of it to light (through a mask, for example) and developed. This forms a desired pattern on the top imaging layer, as seen in FIG. 2, for example. The pattern can be used as an etch mask for etching the organic underlayer 214.

In an exemplary embodiment, organic layer 214 is deposited on top of polysilicon layer 212. Organic layer 214 and imaging layer 216 can be utilized as a bi-layer resist. In an exemplary embodiment, organic layer 214 is spun onto a wafer containing underlayers. Organic layer 214 can have a thickness greater than the underlayers and the imaging layer. After a pre-baking of organic layer 214, thin imaging layer 216 is deposited. In an exemplary embodiment, imaging layer 216 is then exposed to the radiation of light and silylated (using a Desire process, for example). Thus, the exposed area will contain silicon while unexposed area will not. A high resolution pattern can then be created in imaging layer 216 by selectively etching away the area that does not contain Silicon. Since imaging layer 216 is a thin layer, it is good for imaging a precise pattern.

The image created in the imaging layer can be precisely transferred to organic layer 214 using imaging layer 216 as a blank exposure mask or as an etching mask to pattern organic layer 214.

Figure 3:
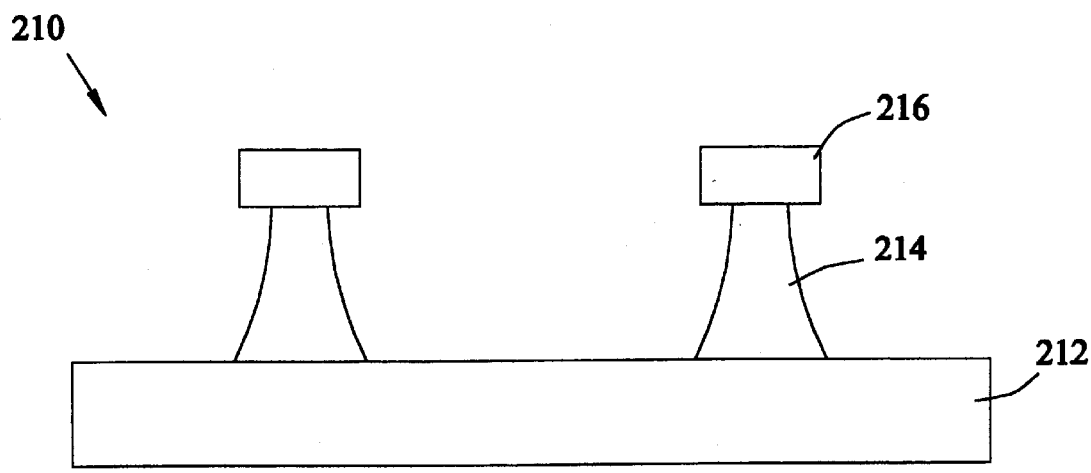
FIG. 3 is a schematic cross-sectional view representation of a portion of an integrated circuit, showing an etching step.

After imaging layer 216 is formed, trim etch techniques can be applied. A trim etch slims the organic line formed by the layer 216 using isotropic etch in a controlled manner in a high-density plasma etching system. Referring now to FIG. 3, an isotropic etch is applied to a silylated portions of layer 216. After the isotropic etch, imaging layer 216 is stripped using an etching process or, alternatively, a hydrofluoric acid (HF) dip. Layer 212 is now exposed and can be etched away.

Figure 4:
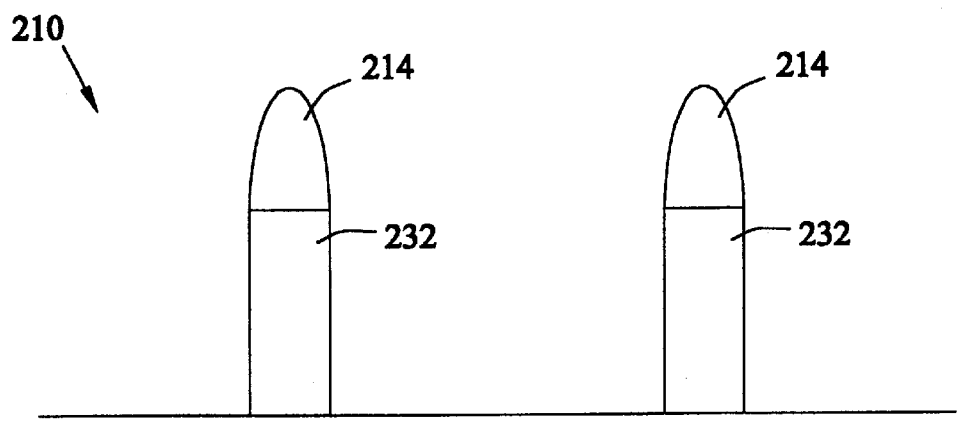
FIG. 4 is a perspective schematic cross-sectional view representation of a portion of an integrated circuit, showing a gate structure formation step.

Referring now to FIG. 4, polysilicon layer 212 is selectively etched using remaining portions of organic layer 214 to mask the pattern. Advantageously, the pattern created in the layer 212 includes widths which are less than one lithographic feature.

Remaining portions of polysilicon layer 212 can serve as gate structures 232. Advantageously, gate structures 232 have a width or critical dimension of 30–100 nm. Gate structures 232 correspond to gate structure 118 described with reference to FIG. 1.

Referring again to FIG. 1, source and drain regions 122 and 124 are formed in substrate 114, extensions 123 and 125 are formed, a silicide layer is deposited, and spacers 162 are provided. In another exemplary embodiment, additional features are formed during the integrated circuit fabrication process.

Advantageously, the process described with reference to FIGS. 1–4 provides for use imaging layer 216 and trimming etch of organic layer 214. Imaging layer 216 prevents resist erosion and pattern collapsing during trim etch processes, the pattern created in layer 212 includes widths which are less than one lithographic feature. As such, gate structures can be formed with higher accuracy and small critical dimensions.

While the exemplary embodiments illustrated in the figures and described above are presently preferred, it should be understood that these embodiments are offered by way of example only. Other embodiments may include, for example, different methods of patterning or etching various layers as well as different methods of application of image layer 216. The invention is not limited to a particular embodiment, but extends to various modifications, combinations, and permutations that nevertheless fall within the scope and spirit of the appended claims.

What is claimed is:

1. A method of fabricating an integrated circuit, the method comprising:
    depositing an organic underlayer over a layer of polysilicon;
    depositing an imaging layer over the organic underlayer;
    silylating at least a portion of the imaging layer;
    removing at least a portion of the imaging layer to form a pattern;
    trim etching the organic underlayer to form a pattern smaller than the pattern of the imaging layer, wherein the pattern in the organic underlayer includes a width that tapers from a first width adjacent to the imaging layer to a second width adjacent to the layer of polysilicon, wherein the second width is greater than the first width;
    removing the pattern of the imaging layer; and
    removing portions of the polysilicon layer using the pattern formed from the removed portions of organic underlayer.

2. The method of claim 1, wherein the step of depositing the organic underlayer comprises spin applying a layer of material containing silicon.

3. The method of claim 1, wherein the step of silylating at least a portion of the imaging layer includes exposing and developing the image layer.

4. The method of claim 1, wherein the step of trim etching the organic underlayer comprises providing an isotropic etch to the organic underlayer.

5. The method of claim 1, further comprising removing the imaging layer.

6. A method of forming a gate in an integrated circuit, the method comprising:
    providing a gate material layer;
    providing an organic hard mask layer over the gate material layer;
    providing an image layer over the organic mask layer;
    silylating portions of the image layer;
    removing at least a portion of the image layer;
    etching the organic hard mask layer with an undercutting technique, wherein the step of etching the organic hard mask layer comprises forming an organic line having a first width proximate the image layer and a second width proximate the gate material layer, the second width being greater than the first width; and
    etching the gate material layer to form gate structures.

7. The method of claim 6, wherein the organic hard mask layer is silicon-containing organic material.

8. The method of claim 6, wherein the gate structures have a critical dimension of 30–100 nm.

9. A method of preventing resist erosion and pattern collapse during an undercut etch—trim etch process in the manufacture of a gate structure, the method comprising:
    depositing an organic hard mask material layer over a polysilicon layer;
    providing an imaging layer over the organic hard mask material layer;
    silylating at least a portion of the imaging layer;
    selectively etching the imaging layer to form a patterned imaging layer;
    removing portions of the organic hard mask material layer uncovered by the patterned imaging layer to form an organic line having a width less than the patterned imaging layer, wherein the organic line has a width that tapers from a first width proximate the imaging layer to a greater second width proximate the polysilicon layer; and
    removing portions of the polysilicon layer uncovered by the organic line to form gate structures.

10. The method of claim 9, wherein the step of silylating at least a portion of the imaging layer comprises exposing at least a portion of the imaging layer to light radiation.

11. The method of claim 9, further comprising doping a substrate below the polysilicon layer to form active regions.

12. The method of claim 9, wherein the organic hard mask material layer includes a silicon-containing low-k (SILK) material.

13. The method of claim 9, wherein the formed gate structures have a width of 30–100 nm.

14. The method of claim 1, wherein the imaging layer has a thickness between 500 and 2000 angstroms and the organic underlayer has a thickness between 500 and 3000 angstroms.

15. The method of claim 1, wherein the step of trim etching the organic underlayer comprises forming a concave surface on a sidewall of the organic underlayer.

16. The method of claim 1, wherein the step of removing the pattern of the imaging layer comprises forming a rounded pattern of the organic underlayer.

17. The method of claim 6, wherein the image layer has a deposited thickness of between 500 and 2000 angstroms and the organic hard mask layer has a deposited thickness of between 500 and 3000 angstroms.

18. The method of claim 6, wherein the organic line includes first and second surfaces, each of the first and second surfaces having a concave shape.

19. The method of claim 9, wherein the imaging layer has a thickness between 500 and 2000 angstroms and the organic hard mask layer has a thickness between 500 and 3000 angstroms.

20. The method of claim 9, wherein the organic line includes first and second sidewalls, each of the first and second sidewalls including a concave shape.

21. A method of fabricating an integrated circuit comprising:

depositing an organic underlayer over a layer of polysilicon;

forming a silylated imaging layer over the organic underlayer;

forming a pattern in the silylated imaging layer;

trim etching the organic underlayer to form a pattern smaller than the pattern of the imaging layer, wherein the etched organic underlayer has a first width adjacent the imaging layer and a second width adjacent to the layer of polysilicon, the first width being different than the second width; and patterning the layer of polysilicon to form a gate structure using the etched organic underlayer as a mask.

22. The method of claim 21, wherein the step of forming a gate structure comprises rounding the etched organic underlayer.

23. The method of claim 21, wherein the second width is greater than the first width.

24. The method of claim 21, wherein the etched organic underlayer has a first side and a second side, wherein at least one of the first side and the second side has a generally concave shape.

25. The method of claim 21, further comprising stripping the imaging layer.

26. The method of claim 21, further comprising forming spacers adjacent to the gate structure.

* * * * *